United States Patent [19]
Pfiester et al.

[11] Patent Number: 5,082,794
[45] Date of Patent: Jan. 21, 1992

[54] METHOD OF FABRICATING MOS TRANSISTORS USING SELECTIVE POLYSILICON DEPOSITION

[75] Inventors: James R. Pfiester; Frank K. Baker; Richard D. Sivan, all of Austin, Tex.

[73] Assignee: Motorola, Inc., Schaumburg, Ill.

[21] Appl. No.: 569,097

[22] Filed: Aug. 17, 1990

Related U.S. Application Data

[62] Division of Ser. No. 309,589, Feb. 13, 1989, Pat. No. 4,954,854.

[51] Int. Cl.$^5$ .................... H01L 21/28; H01L 21/336
[52] U.S. Cl. ......................................... 437/40; 437/41; 437/44; 437/89; 437/191; 437/233; 148/DIG. 122
[58] Field of Search .................. 437/40, 41, 44, 89, 437/90, 233, 186, 191, 193, 203, 56, 57, 34, 27, 28, 29, 30; 357/23.3; 148/DIG. 122

[56] References Cited

U.S. PATENT DOCUMENTS

| | | | |
|---|---|---|---|
| 4,939,100 | 7/1990 | Jeuch et al. | 437/203 |
| 4,948,745 | 8/1990 | Pfiester et al. | 437/56 |
| 4,948,747 | 8/1990 | Pfiester | 437/52 |
| 4,963,504 | 10/1990 | Huang | 437/233 |
| 4,963,506 | 10/1990 | Liaw et al. | 437/89 |
| 4,966,864 | 10/1990 | Pfiester | 437/52 |
| 4,975,385 | 12/1990 | Beinglass et al. | 437/44 |

OTHER PUBLICATIONS

Huang et al., "Eliminating Spacer-Induced Degradations in LDD Transistors", 3rd. Int'l. Symposium on VLSI Technology Systems and Applications, May 1987.
Borland et al., "Selective Silicon Deposition for the Megabit Age", Solid State Technology, Jan. 1990, pp. 73-78.
Pfiester et al., "A Self-Aligned LDD/Channel Implanted ITLDD Process with Selectively-Deposited Poly Gates for CMOS VLSI", IEDM 1989, pp. 769-772.

*Primary Examiner*—Olik Chaudhuri
*Assistant Examiner*—M. Wilczewski
*Attorney, Agent, or Firm*—James L. Clingan, Jr.

[57] ABSTRACT

In forming a lightly-doped drain (LDD) transistor there is first formed a thin polysilicon layer over a gate oxide on an active region. A masking layer is deposited and selectively etched to expose a middle portion of the polysilicon layer. This structure can be used as part of a process which results ina formation of an inverse-T transistor or a conventional LDD structure which is formed by disposable sidewall spacers. The exposed middle portion of the polysilicon layer is used to form a polysilicon gate by selective polysilicon deposition. The exposed middle portion can be implanted through for the channel implant, thus providing self-alignment to the source/drain implants. Sidewall spacers can be formed inside the exposed portion to reduce the channel length. These sidewall spacers can be nitride to provide etching selectivity between the sidewall spacer and the conveniently used low temperature oxide (LTO) mask.

20 Claims, 4 Drawing Sheets

5,082,794

METHOD OF FABRICATING MOS TRANSISTORS USING SELECTIVE POLYSILICON DEPOSITION

This is a division of application Ser. No. 07/309,589, filed Feb. 13, 1989, now U.S. Pat. No. 4,954,854.

FIELD OF THE INVENTION

The invention relates to MOS, integrated circuit, transistor device structures, and more particularly, to integrated circuits which include device structures of MOS transistors which have a lightly-doped drain (LDD).

BACKGROUND OF THE INVENTION

In the typical manufacture of lightly-doped drain (LDD) transistors, a first layer of polysilicon is etched to form a gate, and source and drain regions are lightly doped using the gate as a mask. Then sidewall spacers are formed by forming oxide on the sides of the polysilicon gate. The sidewall spacers act as a mask for a subsequent heavy implant so that a portion of each of the source and drain regions is heavily doped. One of the main purposes of using LDD transistors is to reduce the number of hot electrons which are generated. In LDD structures, however, the generation of hot electrons can be an even bigger problem than in structures which have a heavily-doped drain immediately adjacent to the channel. The hot electrons which are generated by impact ionization get into the oxide immediately above the lightly-doped regions of the LDD structures and modulate the series resistance which reduces the transconductance of the transistor. One solution to this problem has been disclosed in an article, "A New LDD Transistor With Inverse T-Gate Structure," Tial-Yuan Huang et al, *IEEE Electron Device Letters*, Vol. EDL-8, No. 4, Apr. 1987. In that case the structure involved an inverse T-shaped polysilicon gate which had a thick portion over the channel and a thin portion which was implanted through by the first implant to form the lightly-doped portions of the source and drain. Sidewall spacers were formed on the thick portion of the polysilicon gate for the mask for the second, heavy implant.

The inverse-T structure, however, has been difficult to reproduce. Thus, the advantages of the structure have been difficult to commercialize because of the absence of a process which could reliably reproduce the inverse-T structure. One of the proposed methods is to stop etching polysilicon when the polysilicon becomes sufficiently thin. This has not been effective as a manufacturing process because of the difficulty of controlling etch rates with the required precision. The etch rate varies even over a single wafer. Thus wafer-to-wafer variation and lot-to-lot variation of polysilicon etch rates has not been considered feasible to control to the degree necessary.

Another problem in LDD structures has been the difficulty in removing sidewall spacers without causing adverse effects. There are situations, however, in which it is desirable to remove the sidewall spacers. One such example is integrated circuits which have an on-board memory array of floating gate transistors. In such situations, the floating gate transistors which comprise the array use hot electrons to advantage so that the LDD structure is undesirable for these transistors which comprise the array, whereas it is desirable for the peripheral circuits to have LDD transistors. In order to make the floating gate transistors non-LDD it is necessary to remove the sidewall spacers prior to a heavy source/drain implant.

SUMMARY OF THE INVENTION

Accordingly, it is an object of the present invention to provide an improved structure at a stage in processing in the manufacture of integrated circuits which have LDD transistors.

It is another object of the present invention to provide an improved process for making integrated circuits which have LDD transistors.

It is yet another object of the invention to provide an improved method for making an inverse-T transistor.

In carrying out these and other objects of the invention, there is provided, in one form, a method for forming a device structure in an active region. An insulator is formed over all of the active region. A polysilicon layer is formed over the insulator layer and over all of the active region. A masking layer is formed over the polysilicon layer to cover all of the active region. An intermediate portion of the masking layer is etched away to leave a first portion and a second portion of the polysilicon layer over the active region covered by the masking layer and to expose a third portion of the polysilicon layer over the polysilicon layer between the first and second portions.

In carrying out these and other objects of the invention, there is provided, in another form, a device structure formed in an active region in a substrate at a stage in processing. There is an insulator layer over all of the active region. A polysilicon layer is over the insulator layer and over all of the active region. A masking layer covers a first portion and a second portion of the polysilicon layer over the active region. The first portion and the second portion are separated by a third portion of the polysilicon layer over the active region not covered by the masking layer.

DETAILED DESCRIPTION OF THE INVENTION

Figure 1:
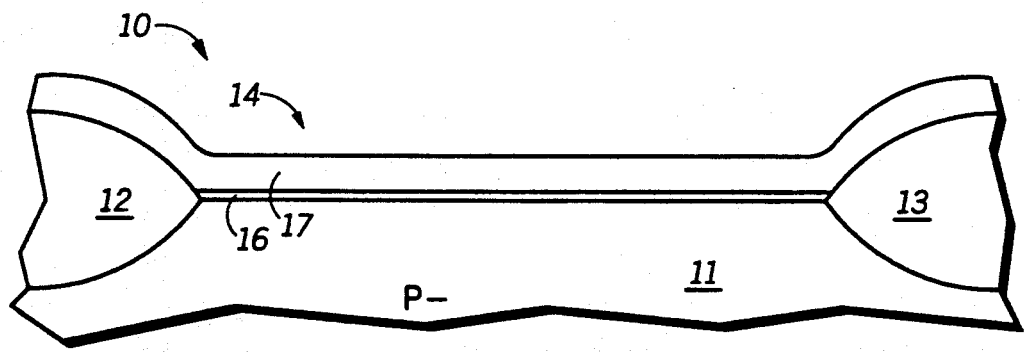
FIG. 1 is a cross-section of a device structure formed in a substrate at a preliminary stage in processing according to the prior art.

Shown in FIG. 1 is a cross-section of a portion 10 of an integrated circuit at a stage in processing comprised of a P-substrate 11, a field oxide region 12, a field oxide region 13, an active region 14 between field oxide regions 12 and 13, a gate oxide layer 16 over active region 14, and a relatively thin polysilicon layer 17 over gate oxide layer 16 in active region 14 and over field oxide regions 12 and 13. The cross-section of FIG. 1 is for the formation of a single transistor of an integrated circuit. The integrated circuit itself can be CMOS and in fact the preferred embodiments described hereinafter contemplate that the integrated circuit is CMOS. Substrate 11 of FIG. 1 can be a well in the integrated circuit. Furthermore the preferred embodiments described are structures and methods for making a single N channel transistor. The structures and methods are also applicable for making P channel transistors.

Figure 2:
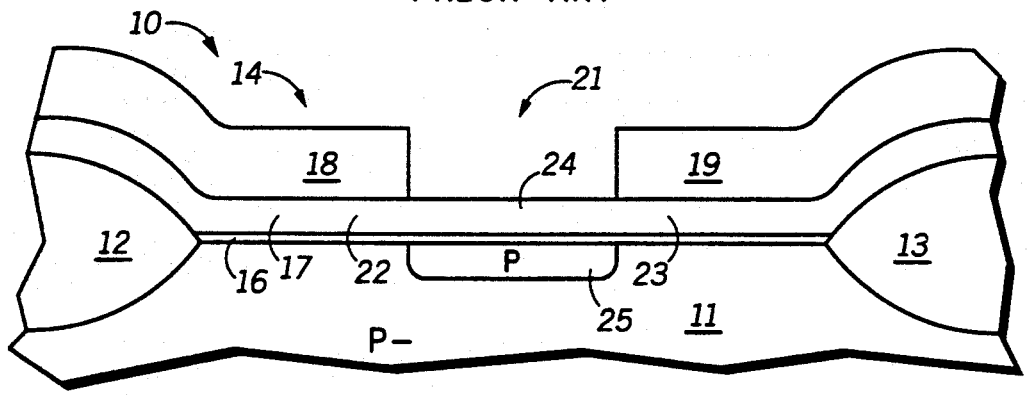
FIG. 2 is a cross-section of the device of FIG. 1 at a later stage in processing according to a preferred embodiment of the invention.
Figure 3:
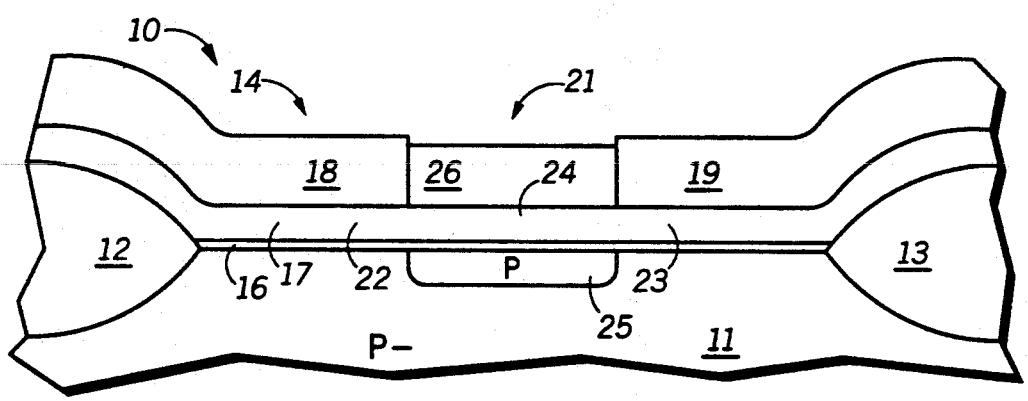
FIGS. 3 is a cross-section of the device of FIG. 2 at a subsequent stage in processing according to one extension of the device of FIG. 2.

After a layer of low-temperature oxide (LTO) is deposited and etched there is then a first portion 18 of LTO and a second portion 19 of LTO as shown in FIG. 2. Although LTO is described as being used, another material, such as tetraethylorthosilicate (TEOS) may be used instead. The etched area leaves a void region 21 between portions 18 and 19 of LTO. There is then a portion 22 of polysilicon layer 17 under portion 18 of LTO and over active region 14, a portion 23 of polysilicon layer 17 under portion 19 of LTO and over active region 14, and a portion 24 of polysilicon layer 17 under region 21 and over active region 14. After the etch which creates region 21, there is a P-type channel implant to create a P region 25 under portion 24 of polysilicon layer 17. This channel implant could also be N-type, especially for P channel transistors. Portions 18 and 19 of LTO act as a mask during the implant. In the prior art the channel implant was performed after either an oxide layer was formed over the active region or after a thin polysilicon layer was formed over the oxide layer and thus the channel implant went into the entire active region. In lightly-doped drain (LDD) structures this may be a concern for short-channel devices because the lightly-doped portions of the LDD structure can be significantly affected by the moderate doping level of the P-type channel implant. Region 25 shown in FIG. 2 is confined to the channel region of a transistor to be subsequently formed. Consequently, region 25 does not adversely affect the lightly-doped portions of the subsequently formed lightly-doped drains.

A selective polysilicon deposition is performed so that polysilicon is deposited in region 21 on portion 24 of polysilicon layer 17 to result in the formation of a polysilicon gate 26. Selective polysilicon deposition is a technique known in the art in which polysilicon is deposited only where there is exposed silicon present. Thus, during a selective polysilicon deposition, polysilicon is not deposited on portions 18 and 19 of LTO. No mask is required to prevent the deposition of polysilicon on non-silicon surfaces. Although selective polysilicon deposition is a known technique, it has not been widely used in manufacturing. The normal technique for forming a polysilicon gate is to form a layer of polysilicon over the entire integrated circuit and then etch away unwanted portions which are not covered by photoresist. During the etch process the polysilicon that is covered by the photoresist can be made narrower than polysilicon formed by selective polysilicon deposition using the same lithography. Thus gate lengths can be made smaller for a given lithography limitation using polysilicon defined by an etch. As gate lengths become narrower, however, lithography may not be as significant in limiting the length as the ability of the resulting transistor to actually perform at the narrower length. One advantage of the structure in FIG. 2 is that only the channel is implanted which may sufficient reason to use that structure in processing a transistor than the conventional structure. Layer 17 is shown and described as being polysilicon but that does not preclude the use of additional material such as a refractory metal to be used in combination with layer 17. Similarly, additional material, such as a refractory metal, may be used with selectively deposited polysilicon 26.

Figure 4:
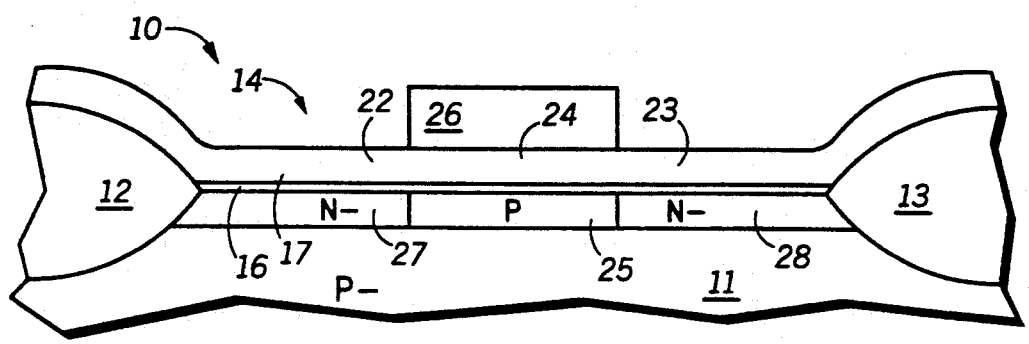
FIG. 4 is a cross-section of the device of FIG. 3 at a stage in processing according to one extension of the device of FIG. 3.
Figure 5:
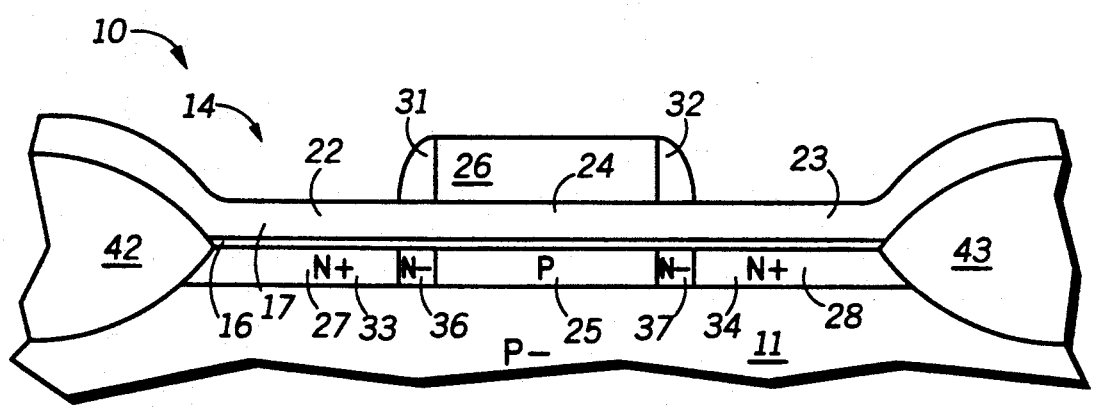
FIGS. 5 is a cross-section of the device of FIG. 4 at a subsequent stage in processing according to one extension of the device of FIG. 4.

Portions 12 and 13 are then removed as shown in FIG. 4. After portions 12 and 13 have been removed, an N-implant is performed, using polysilicon gate 26 as a mask, to form a source region 27 under portion 22 of polysilicon layer 17 and a drain region 28 under portion 23 of polysilicon layer 17 as shown in FIG. 4. Sidewall spacers 31 and 32 are then formed along sidewalls of polysilicon gate 26 as shown in FIG. 5. Sidewall spacer 31 covers a portion of source region 27 adjoining channel region 25. Sidewall spacer 32 covers a portion of drain region 28 adjoining channel region 25. After formation of sidewall spacers 31 and 32, a heavy implant is performed to form heavily-doped region 33 in source region 27 and heavily-doped region 34 in drain region 28. An advantage of the structure of FIG. 5 is that charge that is developed by implanting is bled off by polysilicon layer 17. Charge accumulation which can occur during an implant can actually became sufficiently large to breakdown and thus damage oxide insulating layers. Another advantage is that gate oxide layer 16 is protected from being damaged by the implant. There is then left a lightly-doped portion 36 in source region 27 and a lightly-doped region 37 in drain region 28. Portions 36 and 37 are under sidewall spacers 31 and 32, respectively, both of which act as a mask during this heavy implant. Polysilicon gate 26 also acts as a mask so that channel region 25 is unaffected by the heavy implant.

Figure 6:
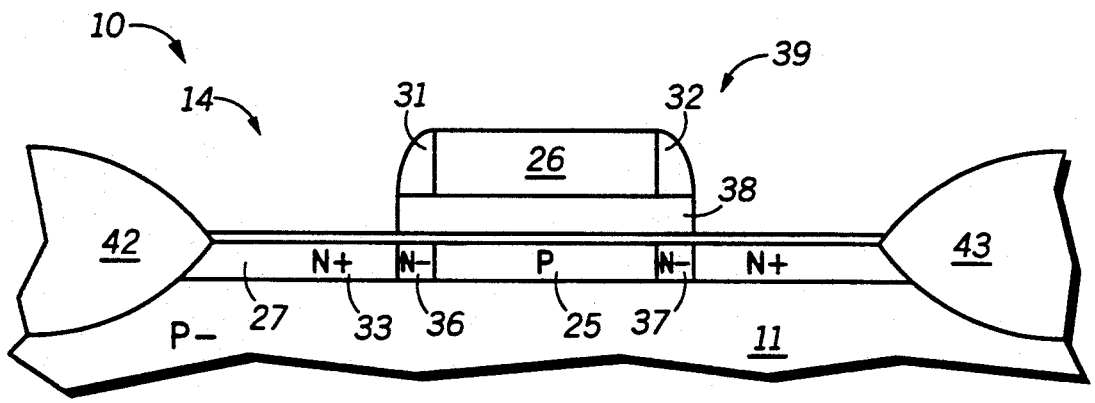
FIG. 6 is a cross-section of the device of FIG. 5 at a stage in processing according to one extension of the device of FIG. 5.

Sidewall spacers 31 and 32 and polysilicon gate 26 also act as mask for a polysilicon etch which follows. The polysilicon etch removes portions of polysilicon layer 17 which are over heavily-doped portion 33 and heavily-doped portion 34. This leaves a portion 38 of polysilicon layer 17 under sidewall spacers 31 and 32 and polysilicon gate 26 as shown in FIG. 6. This resulting structure is an inverted-T transistor 39. Thus it is seen that from the structure in FIG. 2, an inverted-T transistor can be made. Although the particular combination of processing steps used in developing inverted-T transistor 39 from the structure in FIG. 2 is unique, each individual step uses a technique which is known in the art.

Figure 7:
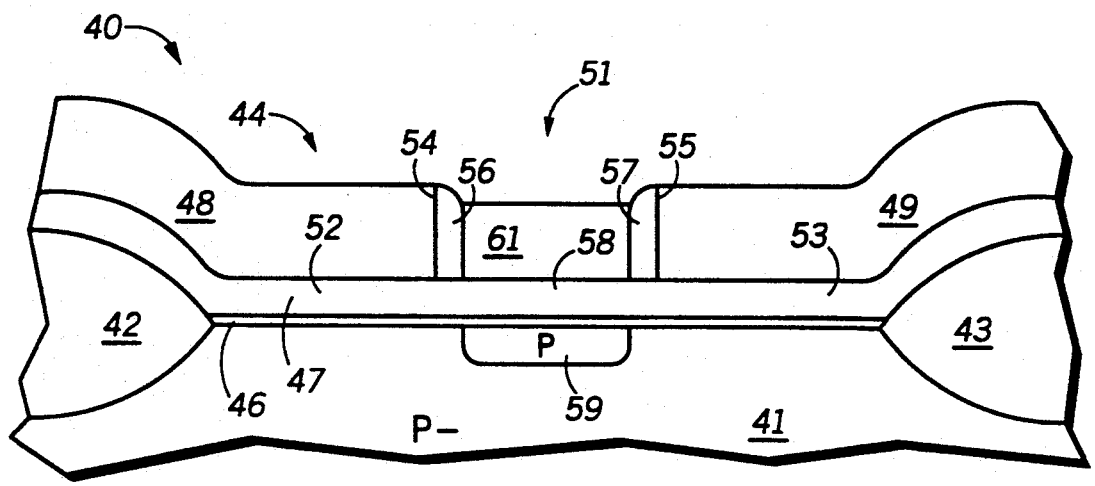
FIGS. 7 is a cross-section of the device of FIG. 2 at a subsequent stage in processing according to another extension of the device of FIG. 2.

Shown in FIG. 7 is a portion 40 of an integrated circuit at a stage in processing with a variation on the process depicted in FIGS. 3–6. Portion 40 comprises elements analogous to those of portion 10 of FIG. 2 as follows; a P-substrate 41, a field oxide region 42, a field oxide region 43, an active region 44 between field oxide regions 42 and 43, a gate oxide layer 46 over active region 44, a polysilicon layer 47 over gate oxide layer 46, a region 48 of LTO, a region 49 of LTO, a void region 51 between regions 48 and 49 of LTO, a portion 52 of polysilicon layer 47 under region 48 of LTO, and a portion 53 of polysilicon layer 47 under region 49 of LTO. The structure of FIG. 2 shows a layer of LTO which has been etched to form regions 18 and 19. Each of these regions has a sidewall. Similar sidewalls are shown in FIG. 7 as a sidewall 54 and a sidewall 55. Sidewall spacers 56 and 57 are formed adjoining sidewalls 54 and 55 and separated by a portion 58 of polysilicon layer 47. Sidewall spacers 56 and 57 are made from a layer of material such as nitride which has been subjected to a reactive ion etch (RIE). This is achieved in substantially the same manner as is conventional for sidewall spacers using LTO except a nitride layer is deposited instead of a layer of LTO. After the nitride layer is deposited, a subsequent RIE results in nitride remaining along sidewalls such as sidewalls 54 and 55. A channel implant is then performed using sidewall spacers 56 and 57 as a mask to form a moderately-doped region 59 under a portion 58 of polysilicon layer 47 which is between sidewall spacers 56 and 57. A polysilicon gate 61 is then formed using selective polysilicon deposition. Polysilicon gate 61 is thus over portion 58 of polysilicon layer 47 and over channel implant portion 59.

Figure 8:
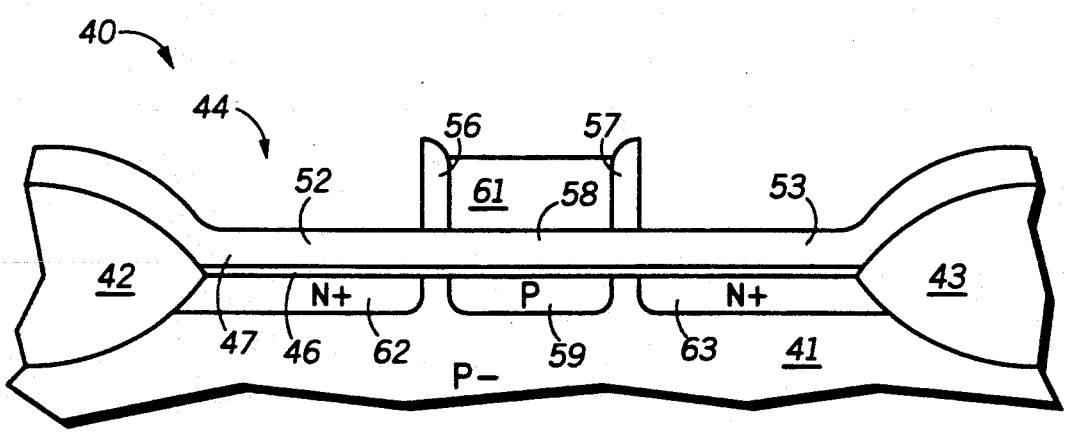
FIG. 8 is a cross-section of the device of FIG. 7 at a stage in processing according to one extension of the device of FIG. 7.
Figure 9:
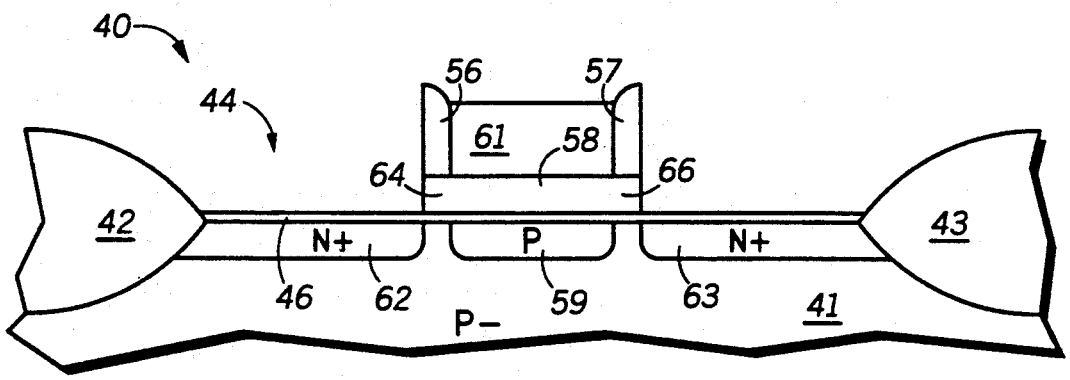
FIGS. 9 is a cross-section of the device of FIG. 8 at a subsequent stage in processing according to one extension of the device of FIG. 8.

Regions 48 and 49 of LTO are then etched away using sidewall spacers 56 and 57 and polysilicon gate 61 as a mask. This etch leaves portions 52 and 53 of polysilicon layer 47 uncovered by sidewall spacers 56 and 57 and polysilicon gate 61. A heavy implant is then performed using sidewall spacers 56 and 57 and polysilicon gate 61 as a mask. The result of the etch and the heavy implant is shown in FIG. 8. The implant results in forming a heavily-doped region 62 under portion 52 of polysilicon layer 47 and a heavily-doped region 63 under portion 53 of polysilicon layer 47. Portions 52 and 53 of polysilicon layer 47 are then etched away using sidewall spacers 56 and 57 as a mask. This leaves a portion 64 of polysilicon layer 47 under sidewall spacer 56 and a portion 66 of polysilicon layer 47 under sidewall spacer 57. The result of this polysilicon etch is shown in FIG. 9.

Nitride sidewall spacers 56 and 57 are etched away to prepare for a light implant. A light implant is performed to form a lightly-doped region 67 under portion 64 and a lightly-doped region 68 under portion 66. The result is an inverse-T transistor 69 shown in FIG. 10 comprised of a source comprised of lightly-doped region 67 and heavily-doped region 62, a drain comprised of lightly-doped region 68 and a heavily-doped region 63, and a gate comprised of polysilicon gate 61.

Figure 10:
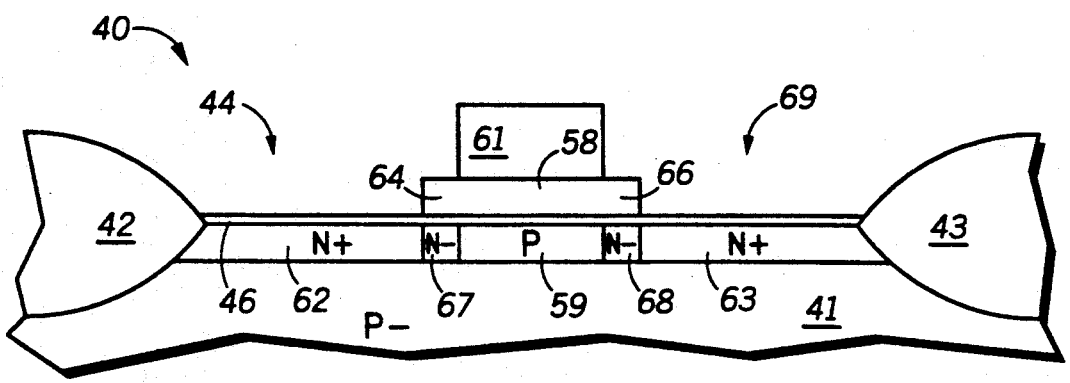
FIGS. 10 is a cross-section of the device of FIG. 3 at a subsequent stage in processing according to another extension of the device of FIG. 3.

Other variations derived from the structure of FIG. 7 are also possible. One variation is to etch the nitride sidewall spacers prior to performing the heavy implant. This can be done at other transistor locations on the integrated circuit other than at portion 40 shown in FIG. 7. In such case there would be formed a normal transistor that is neither inverse-T nor LDD which may be desirable. An example is the case of an integrated circuit which has an electrically programmable read only memory (EPROM) array portion which employs floating gate transistors. Since EPROMs use hot electrons for programming and whereas LDD transistors are used to reduce hot electrons, it is desirable that the floating gate transistors which comprise the EPROM array be non-LDD transistors. On the other hand, it may be desirable for the transistors in the support circuits to be LDD transistors in which case it would be desirable to have LDD and non-LDD transistors on the same integrated circuit. This can also be true for any CMOS integrated circuit in which it is desirable for the N-channel transistors to be LDD and some or all of the P channel transistors to be non-LDD transistors. In CMOS where the P channel transistors may or may not be non-LDD transistors, the etching away of the LTO over the P channel transistors is blocked with photoresist while LTO over N channel regions, such as regions 48 and 49 of LTO, are being etched away. After the heavy implant which causes regions 62 and 63, it has been found to be desirable to perform an anneal. This anneal must be performed before the light implant because the photoresist cannot withstand the anneal. Thus, in the prior art, an additional masking step would typically be required for the subsequent lightly-doped source/drain implant. In forming the structure of FIG. 7 for an N channel transistor, LTO can still be over the P channel transistors so the anneal can be performed while retaining the mask over the P channel transistors. Thus, the light implant can be performed on the N-channel transistors while retaining the LTO mask over the P channel transistors. For the P channel transistors, the processing can be the same, except with the appropriate dopant type and species for a P channel transistor, as shown in FIGS. 8–10 or can be modified by, for example, removing the nitride spacers prior to the heavy implant. Although another material than nitride might be used for sidewall spacers 56 and 57, there is an advantage to having the sidewall spacers be of a material which is different than oxide so that there can be selectivity between the etching of the LTO regions and the sidewall spacers. Similarly, it may desirable to form regions 48 and 49 out of some material other than LTO.

Figure 11:
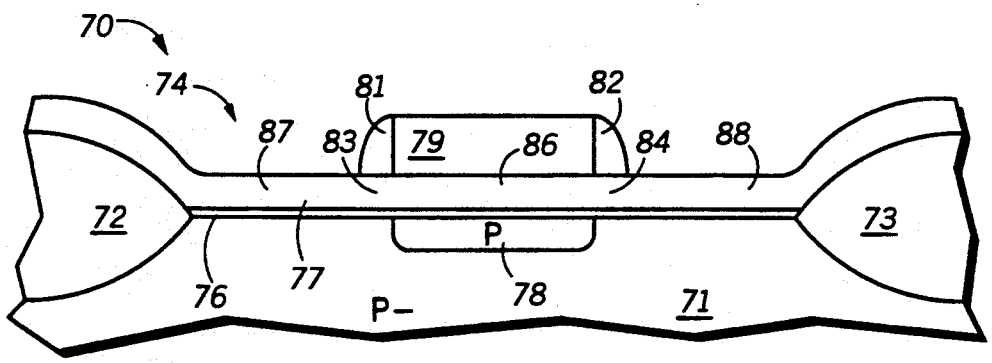
FIG. 11 is a cross-section of the device of FIG. 10 at a stage in processing according to one extension of the device of FIG. 10.
Figure 12:
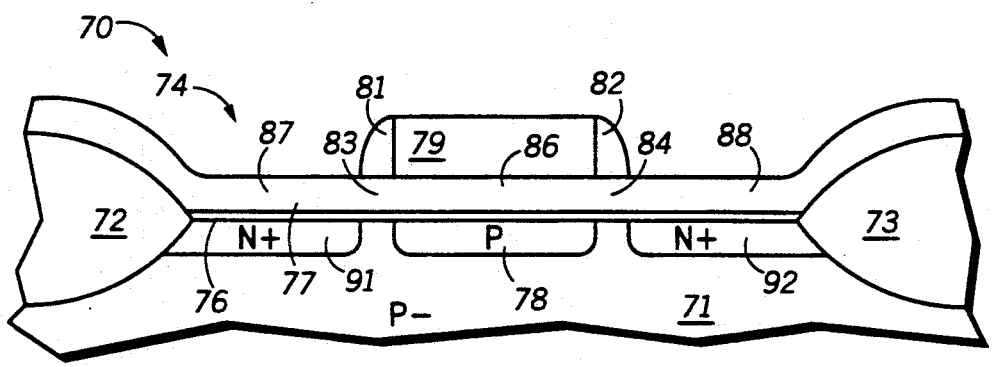
FIGS. 12 and 13 are cross-sections of the device of FIG. 11 at subsequent stages in processing according to one extension of the device of FIG. 11
Figure 13:
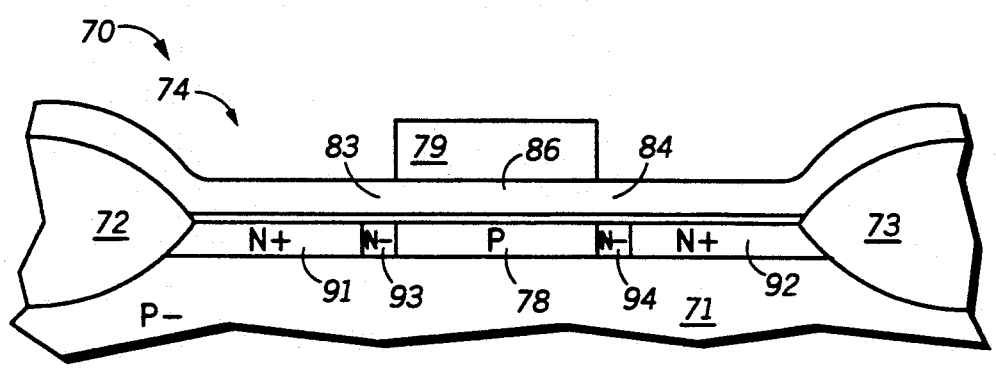

Shown in FIG. 11 is a portion 70 of an integrated circuit at a stage in processing with a variation on the process depicted in FIGS. 4–6. Portion 70 comprises elements analogous to those of portion 10 of FIG. 3 as follows; a P-substrate 71, a field oxide region 72, a field oxide region 73, an active region 74 between field oxide regions 72 and 73, a gate oxide layer 76 over active region 74, a polysilicon layer 77 over gate oxide layer 76, a P channel region 78, and a polysilicon gate 79. Following the structure of FIG. 3, regions 18 and 19 of LTO were removed. This is also done in obtaining the structure of FIG. 11. To obtain the structure of FIG. 4 there was then a light implant. To obtain the structure of FIG. 11, however, sidewall spacers 81 and 82 are formed instead of performing a light implant. Sidewall spacers 81 and 82 cover portions 83 and 84 of polysilicon layer 77. A portion 86 of polysilicon layer 77 is under polysilicon gate 79. This leaves a portion 87 and a portion 88 of polysilicon layer 77 uncovered over active region 74. A heavily-doped implant is then performed using sidewall spacers 81 and 82 and polysilicon gate 79 as a mask. The result of this implant is the formation of a heavily-doped region 91 under portion 87 of polysilicon layer 77 and a heavily-doped region 92 under portion 88 of polysilicon layer 77 as shown in FIG. 12. This is followed by etching away sidewall spacers 81 and 82. This can be done at this stage because polysilicon layer 77 protects gate oxide layer 76 during the etch of sidewall spacers 81 and 82 which are typically LTO. After sidewall spacers 81 and 82 are removed, a light implant causes the formation a lightly-doped region 93 under portion 83 of polysilicon layer 77 and a lightly-doped region 94 under portion 84 of polysilicon layer 77 as shown in FIG. 13.

There is a thermal anneal performed following the heavily-doped implant and before the light implant. Performing the anneal allows the heavily-doped portion of the source and drain structures to be driven in sufficiently to accommodate a later formed silicide contact. Also the anneal of the heavy N+ implant repairs lattice damage which was caused by the heavy implant. The light implant is, therefore, not subjected to the high temperature thermal anneal of the heavy implant and is thus more shallow. In addition, this anneal repairs the silicon implant damage and this results in a lower dopant diffusivity for the lightly-doped region. For the case in which there are also P channel transistors being formed on the same integrated circuit as that of portion 70, such regions where the P channel regions are being formed are covered by LTO which acts as a mask during the processing of the N channel devices. Thus, the anneal can occur without requiring the removal of the LTO mask which covers the P channel active regions.

Another possibility for the structure of FIG. 11 is to selectively remove sidewall spacers. The structure of FIG. 11, with varying channel lengths, at the particular stage in processing would be present at all N channel active regions. Some of the sidewall spacers, such as sidewall spacers 81 and 82, could be removed prior to the heavy implant. This is particularly useful in an integrated circuit that has a floating gate array in which the sidewall spacers in the array could be removed prior to the heavy implant.

In the preferred embodiments shown, the first layer of oxide is about 120 Angstroms in thickness, the first layer of polysilicon is about 500 Angstroms in thickness, and the selectively deposited polysilicon is about 3000 Angstroms in thickness. Other thicknesses may be chosen as appropriate. The drawings in the FIGS. are made to be easily comprehensible not to be precisely proportional. For example, the selectively deposited polysilicon is much thicker, proportionally, than is shown in the FIGS. Also in this regard the heavily-doped, lightly-doped, and channel regions are all shown as being of the same depth. The relative depths of these regions, however, may vary. The depths of these regions are selectable according to the implant characteristics which are chosen to achieve particular characteristics associated with those implants.

While the invention has been described in specific embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A method for forming a device structure in an active region, comprising:
   forming an insulator layer over all of the active region;
   forming a polysilicon layer over the insulator layer and over all of the active region;
   forming a masking layer over the polysilicon layer to cover all of the active region;
   etching away an intermediate portion of the masking layer to leave a first portion and a second portion of the polysilicon layer over the active region covered by the masking layer and to expose a third portion of the polysilicon layer over the polysilicon layer between the first and second portions;
   forming a first sidewall spacer along the first sidewall to cover a fourth portion of the the polysilicon layer in said third portion;
   forming a second sidewall spacer on the second sidewall to cover a fifth portion of the polysilicon layer, said fourth and fifth portions being separated by a sixth portion of the polysilicon layer; and
   selectively depositing silicon to form a polysilicon gate on the third portion of the polysilicon layer between the first and second sidewalls.

2. The method of claim 1 further comprising:
   etching away the masking layer.

3. The method of claim 2 further comprising:
   implanting into the active region using the first and second sidewall spacers and the polysilicon gate as a mask.

4. The method of claim 3 further comprising:
   etching away the first and second sidewall spacers.

5. The method of claim 4 further comprising:
   implanting into the active region using the polysilicon gate as a mask.

6. The method of claim 1 further comprising:
   implanting through the sixth portion of the polysilicon layer, prior to selectively depositing silicon, using the unetched portions of the masking layer and the first and second sidewall spacers as a mask to form a channel region in the active region under the sixth portion of the polysilicon layer.

7. The method of claim 6 further comprising:
   etching away the masking layer;
   implanting into the active region using the first and second sidewall spacers and the polysilicon gate as a mask;
   etching away the first and second sidewall spacers; and
   implanting into the active region using the polysilicon gate as a mask.

8. A method for forming a device structure in an active region, comprising:
   forming an insulator layer over all of the active region;
   forming a polysilicon layer over the insulator layer and over all of the active region;
   forming a masking layer over the polysilicon layer to cover all of the active region;
   etching away an intermediate portion of the masking layer to leave a first portion and a second portion of the polysilicon layer over the active region covered by the masking layer and to expose a third portion of the polysilicon layer over the polysilicon layer between the first and second portions;
   implanting through the third portion of the polysilicon layer using the unetched portions of the masking layer as a mask to form a channel region in the active region under the third portion of the polysilicon layer; and
   selectively depositing polysilicon on the third portion of the polysilicon layer to provide a polysilicon gate.

9. The method of claim 8 further comprising:

removing the masking layer.

10. The method of claim 9 further comprising:
implanting through the first and second portions of the polysilicon layer using the polysilicon gate as a mask to form a drain region in the active region under the first portion of the polysilicon layer and a source region in the active region under the second portion of the polysilicon layer;

forming a first sidewall spacer on the polysilicon layer, along a first side of the polysilicon gate, and over a first portion of the source region to leave a second portion of the source region uncovered by the first sidewall spacer;

forming a second sidewall spacer on the polysilicon layer, along a second side of the polysilicon gate, and over a first portion of the drain region to leave a second portion of the drain region uncovered by the second sidewall spacer; and implanting into the second portion of the source region and the second portion of the drain region using the first sidewall spacer, the second sidewall spacer, and the polysilicon gate as a mask.

11. The method of claim 9 further comprising:
forming a first sidewall spacer on the polysilicon layer, along a first side of the polysilicon gate, and over a fourth portion of the polysilicon layer which is in the first portion of the polysilicon layer leaving a fifth portion of the polysilicon layer which is in the first portion of the polysilicon layer uncovered by the first sidewall spacer;

forming a second sidewall spacer on the polysilicon layer, along a second side of the polysilicon gate, and over a sixth portion of the polysilicon layer which is in the second portion of the polysilicon layer leaving a seventh portion of the polysilicon layer which is in the second portion of the polysilicon layer uncovered by the second sidewall spacer;

implanting through the fifth and seventh portions of the polysilicon layer using the polysilicon gate and the first and second sidewall spacers as a mask to form a first heavily-doped region under the fifth portion of the polysilicon layer and a second heavily-doped region under the seventh portion of the polysilicon layer;

etching away the first and second sidewall spacer; and implanting through the first and second portions of the polysilicon layer using the polysilicon gate as a mask to form a first lightly-doped region under the fourth portion of the polysilicon layer and a second lightly-doped region under the sixth portion of the polysilicon layer.

12. A method for forming a device structure in an active region, comprising:
forming an insulator layer over all of the active region;
forming a polysilicon layer over the insulator layer and over all of the active region;
forming a masking layer over the polysilicon layer to cover all of the active region;
etching away an intermediate portion of the masking layer to leave a first portion and a second portion of the polysilicon layer over the active region covered by the masking layer and to expose a third portion of the polysilicon layer over the polysilicon layer between the first and second portions; and selectively depositing polysilicon on the third portion of the polysilicon layer to provide a polysilicon gate.

13. The method of claim 12 further comprising:
removing the masking layer.

14. The method of claim 13 further comprising:
implanting through the first and second portions of the polysilicon layer using the polysilicon gate as a mask to form a drain region in the active region under the first portion of the polysilicon layer and a source region in the active region under the second portion of the polysilicon layer.

15. The method of claim 14 further comprising:
forming a first sidewall spacer on the polysilicon layer, along a first side of the polysilicon gate, and over a first portion of the source region to leave a second portion of the source region uncovered by the first sidewall spacer; and forming a second sidewall spacer on the polysilicon layer, along a second side of the polysilicon gate, and over a first portion of the drain region to leave a second portion of the drain region uncovered by the second sidewall spacer.

16. The method of claim 15 further comprising:
implanting into the second portion of the source region and the second portion of the drain region using the first sidewall spacer, the second sidewall spacer, and the polysilicon gate as a mask.

17. The method of claim 16 further comprising:
etching away portions of the polysilicon layer which are over the second portion of the source region and the second portion of the drain region using the first sidewall spacer, the second sidewall spacer, and the polysilicon gate as a mask.

18. The method of claim 13 further comprising:
forming a first sidewall spacer on the polysilicon layer, along a first side of the polysilicon gate, and over a fourth portion of the polysilicon layer which is in the first portion of the polysilicon layer leaving a fifth portion of the polysilicon layer which is in the first portion of the polysilicon layer uncovered by the first sidewall spacer; and forming a second sidewall spacer on the polysilicon layer, along a second side of the polysilicon gate, and over a sixth portion of the polysilicon layer which is in the second portion of the polysilicon layer leaving a seventh portion of the polysilicon layer which is in the second portion of the polysilicon layer uncovered by the second sidewall spacer.

19. The method of claim 18 further comprising:
implanting through the fifth and seventh portions of the polysilicon layer using the polysilicon gate and the first and second sidewall spacers as a mask to form a first heavily-doped region under the fifth portion of the polysilicon layer and a second heavily-doped region under the seventh portion of the polysilicon layer.

20. The method of claim 19 further comprising:
etching away the first and second sidewall spacer; and implanting through the first and second portions of the polysilicon layer using the polysilicon gate as a mask to form a first lightly-doped region under the fourth portion of the polysilicon layer and a second lightly-doped region under the sixth portion of the polysilicon layer.

* * * * *